US007538754B2

(12) United States Patent
Tsuda et al.

(10) Patent No.: US 7,538,754 B2
(45) Date of Patent: May 26, 2009

(54) SIGNAL CIRCUIT, DISPLAY APPARATUS INCLUDING SAME, AND METHOD FOR DRIVING DATA LINE

(75) Inventors: Takuya Tsuda, Abiko (JP); Maki Sasagawa, Funabashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 953 days.

(21) Appl. No.: 10/995,196

(22) Filed: Nov. 24, 2004

(65) Prior Publication Data

US 2005/0117384 A1 Jun. 2, 2005

(30) Foreign Application Priority Data

Nov. 28, 2003 (JP) ............................ 2003-400352

(51) Int. Cl.
*G11C 11/00* (2006.01)

(52) U.S. Cl. ...................................... 345/100; 345/103

(58) Field of Classification Search ............. 345/87–89, 345/91, 92, 94, 98, 99, 100, 103
See application file for complete search history.

(56) References Cited

U.S. PATENT DOCUMENTS

| | | | | |
|---|---|---|---|---|
| 6,448,953 | B1 * | 9/2002 | Murade | 345/98 |
| 7,339,571 | B2 * | 3/2008 | Yamamoto et al. | 345/100 |
| 2003/0001831 | A1 * | 1/2003 | Murade | 345/204 |

FOREIGN PATENT DOCUMENTS

| | | | |
|---|---|---|---|
| JP | 2000-122626 | A | 4/2000 |
| JP | 2000-242237 | A | 9/2000 |
| JP | 2000-267616 | | 9/2000 |
| JP | 2000-310963 | A | 11/2000 |
| JP | 2003-099012 | A | 4/2003 |

* cited by examiner

*Primary Examiner*—Amare Mengistu
*Assistant Examiner*—Jennifer Zubajlo
(74) *Attorney, Agent, or Firm*—Harness, Dickey & Pierce

(57) ABSTRACT

A signal circuit of the present invention includes (i) a plurality of signal sources; (ii) a plurality of source lines; and driving means for driving the data lines, the source lines being divided into a plurality of groups, each of the groups including three source lines, adjacent groups constituting one block, wherein: the driving means selects groups which belong to a clump of blocks including a first block, and a second block adjacent to the first block so that, (i) during a first predetermined period, the driving means simultaneously selects groups that belong to the first block, and simultaneously selects groups that belong to the second block, and (ii) during a second predetermined period subsequent to the first predetermined period, the driving means selects groups one by one from groups disposed at respective ends of the clump of blocks, simultaneously selects adjacent groups that belong to different blocks, and selects remaining groups one by one. With this arrangement, it becomes difficult for display unevenness having a vertical-striped shape to be noticeable due to the change in electric potential.

11 Claims, 7 Drawing Sheets

METHOD FOR DRIVING DURING
AN ODD-NUMBERED FRAME PERIOD

METHOD FOR DRIVING DURING
AN EVEN-NUMBERED FRAME PERIOD

SIGNAL CIRCUIT, DISPLAY APPARATUS INCLUDING SAME, AND METHOD FOR DRIVING DATA LINE

This Nonprovisional application claims priority under 35 U.S.C. § 119(a) on Patent Application No. 2003/400352 filed in Japan on Nov. 28, 2003, the entire contents of which are hereby incorporated by reference.

FIELD OF THE INVENTION

The present invention relates to a signal circuit for use in a display apparatus such as a liquid crystal display panel, and to a method for driving data lines of the signal circuit.

BACKGROUND OF THE INVENTION

In a liquid crystal display apparatus, (i) which includes a switch provided in every source line via which a signal (video signal) from a signal line is to be written, and (ii) which carries out a point-at-a-time driving with respect to each pixel, a method for simultaneously supplying signals of two or more channels is adopted so as to lower a driving frequency of the source line.

FIG. 5 is a block diagram illustrating a conventional liquid crystal display apparatus in which signals (video signals) that are supplied via two independent signal channels are supplied to the source lines via sampling switches, and the point-at-a-time drive is carried out.

As shown in FIG. 5, a display section 195 of the liquid crystal display apparatus includes a gate driver 185, a timing signal generating circuit 177, and a shift register 170 having output stages SiR155 and SiR156. The timing signal generating circuit 177 outputs a start pulse HST10. In response to the start pulse HST10, the output stages SiR155 and SiR156 output sampling pulses Vh20.

Then, in response to the sampling pulses Vh20, signals of two independent channels (a-channel and b-channel) are outputted. Specifically, the a-channel signals that respectively correspond to R (red), G (green), and B (blue) are sent to signal lines SLRa149 through SLBa151, respectively. Also, the b-channel signals that respectively correspond to R, G, and B are sent to signal lines SLRb152 through SLBa154, respectively.

Further, in the display section 195, a plurality of gate lines G190, G191, . . . , and the source lines SR101 through SB112 are wired in a matrix manner. For example, the gate line G191 intersects with the source lines SR101 through SB112, respectively, and in their intersections, thin film transistors TR125 through TB136 serving as a switching element are provided, respectively.

The thin film transistors TR125 through TB136 have (i) respective gates connected to the gate line G191, and (ii) sources connected to the source lines SR101 through SB112, respectively, and (iii) drains connected to the pixel capacitance PR113 through PB124, respectively. The source lines SR101 through SB112 are divided into four groups Gr154, Gr155, Gr156, and Gr157 so that each group is constituted by three source lines (that correspond to one pixel). The groups Gr154, Gr155, Gr156, and Gr157 are further divided into two blocks B158 and B159 so that each block is constituted by two groups (that correspond to two pixels) adjacent to each other.

Furthermore, the source lines SR101 through SB112 are connected to the signal lines SLRa149 through SLBb154, via sampling switches SWR137 through SWB148, respectively. The sampling switches SWR137 through SWB148 may be realized by transistors, respectively, and are provided so as to correspond to the source lines SR101 through SB112, respectively.

Specifically, in the group Gr154, the three source lines SR101, SG102, and SB103 are connected to the a-channel signal lines SLRa149, SLGa150, and SLBa151, via the sampling switches SWR137, SWG138, and the SWB139, respectively. Also, in the group Gr155, the three source lines SR104, SG105, and SB106 are connected to the b-channel signal lines SLRb152, SLGb153, and SLBb154, via the sampling switches SWR140, SWG141, and the SWB142, respectively. The groups Gr154 (the a-channel) and Gr155 (the b-channel), which are adjacent to each other, constitute the block B158.

Here, each of the six sampling switches SWR137 through SWB142 in the block B158 is connected to the output stage SiR155 of the shift register 170, and each ON/OFF of the six sampling switches SWR137 through SWB142 is controlled in response to the sampling pulse Vh20 outputted from the output stage SiR155. Further, in response to the sampling pulses Vh20, the signals of the two channels are sent from the respective signal lines (the a-channel: SLRa149 through SLBa151; the b-channel: SLRb152 through SLBb154).

Similarly, in the group Gr156, the three source lines SR107, SG108, and SB109 are connected to the a-channel signal lines SLRa149, SLGa150, and SLBa151, via the sampling switches SWR143, SWG144, and SWB145, respectively. Further, in the group Gr157, the three source lines SR110, SG111, and SB112 are connected to the b-channel signal lines SLRb152, SLGb153, and SLBb154, via the sampling switches SWR146, SWG147, and SWB148, respectively. The groups Gr156 (the a-channel) and Gr157 (the b-channel), which are adjacent to each other, constitute the block B159.

Here, each of the six sampling switches SWR143 through SWB148 of the block B159 is connected to the output stage SiR156 of the shift register 170, and each ON/OFF of the six sampling switches SWR143 through SWB148 is controlled in response to the sampling pulse Vh20 outputted from the output stage SiR156. Further, in response to the sampling pulses Vh20, the signals of the two systems are sent from the signal lines (the a-channel: SLRa149 through SLBa151; the b-channel: SLRb152 through SLBb154), respectively.

In the display section 195 thus arranged, while the gate line G190 or G191 is selected (turned ON) by the gate driver 185, the output stage SiR155 or SiR156 sends, at the same timing, the sampling pulses (selection signals) Vh20 to the sampling switches (such as the sampling switch 137) for every block (or for every group). Accordingly, the signals which are supplied via the signal lines (such as the signal line SLRa149) are written, via the source lines that correspond to the sampling switches, in the pixel capacitance (such as the pixel capacitance PR113), respectively.

Hereinafter, a conventional method for driving the display section 195 is described in detail with reference to FIG. 5 and FIG. 6.

FIG. 6 is a timing chart illustrating the twelve sampling switches SWR137 through SWB148 during an odd-numbered frame period and an even-numbered frame period, the switches SWR137 through SWB148 belonging to the block B158 or B159, each block corresponding to two pixels. FIG. 6 also illustrates electric potential states (writing states of the signals) of the respective twelve source lines SR101 through SB112 that belong to the block 158 or 159, and that correspond to four pixels.

Note that, in FIG. 6, indicated by a symbol T is a period (that corresponds to one cycle of the timing signal) in which the signals are written in two pixels. Note also that the term "frame period" indicates time required for scanning all the gate lines G190, . . . , in the display section 195 (i.e., a period of time required for scanning one screen).

As shown in FIG. 6, in synchronization with a timing signal (not shown) outputted from the timing signal generating circuit 177, simultaneously selected (turned ON) at time t0 are the sampling switches SWR137 through SWB142 of the group Gr154 or Gr155, each group belonging to the block B158.

During a period of time from the time t0 to time t1, the signals which are supplied via the signal lines SLRa149 through SLBb154 are written, at the same timing, in the pixel capacitance PR113 through PB118, via the source lines SR101 through SB106 that are connected to the sampling switches SWR137 through SWB142, respectively.

Thereafter, at the time t1 that is one clock (cycle) after the time t0, a timing signal (not shown) is outputted. In synchronization with the timing signal, (i) simultaneously turned OFF are the sampling switches SWR137 through SWB142 of the group Gr154 or Gr155, each group belonging to the block B158, and (ii) simultaneously selected (turned ON) are the sampling switches SWR143 through SWB148 of the group Gr156 or Gr157, each belonging to the block B 159.

During a period of time from the time t1 to time t2, the signals which are supplied via the signal lines SLRa149 through SLBb154 are written, at the same timing, in the pixel capacitance PR119 through PB124, via the source lines SR107 through SB112 that are connected to the sampling switches SWR143 through SWB148, respectively.

However, according to the method for driving the display section 195, the source line SB106 (edge source line in the block B158) followed by the adjacent block B159 changes in its electric potential due to a parasitic capacitance between the source lines SB106 and SR107 (i.e., electric charge of the parasitic capacitance transfers to (jumps into) the source line SB106). Similarly, the source line SB112 changes in its electric potential due to parasitic capacitance between the source lines SB112 and SR161. This gives rise to the changes in electric potential which has been written in the pixel capacitance PB118 and PB124. These changes arise the problems to be solved.

FIG. 7 schematically shows the parasitic capacitance C201 and C202, the parasitic capacitance C201 existing between the source line SR107 and the source line SB106 (an electrode on a side of the source line of the pixel capacitance PB118), and the parasitic capacitance C202 existing between the source lines SB112 and SR161.

For example, as for the source lines SB106 and SR107, because the sampling switch SWB142 belonging to the block B158 is turned ON at the time t0, the source line SB106 connected to the sampling switch SWB142 receives the signal (electric potential) via the signal line SLBb154 during the period of time from the time t0 to the time t1. Meanwhile, during the period of time from the time t0 to the time t1, the sampling switch SWR143 which belongs to the block B159 adjacent to the block B158 is turned OFF. This causes the source line SR107 connected to the sampling switch SWR143 to keep electric potential which was given one horizontal period ago. Thus, an electric potential difference becomes large between the source line SR107 and the source line SB106 (the electrode on the side of the pixel capacitance PB118) and, the source line SB106 receiving a new current signal (electric potential), whereas the source line SR107 keeping the electric potential which was given one horizontal period ago. This causes the large parasitic capacitance (accumulation of electric charge; see C201 in FIG. 7) between the source lines SB106 and SR107.

When the sampling switch SWR143 is turned ON at the time t1 so that a new signal (electric potential) is given to the source line SR107 connected to the sampling switch SWR143, the electric potential difference between the source line SR106 and the source line SR107 (an electrode on a side of the pixel capacitance PR119) is reduced. Accordingly, electric charge accumulated in the parasitic capacitance C201 transfers to (jumps into) the source line SB106, thereby changing the electric potential of the source line SB106.

Similarly, at the time t2, electric charge of the parasitic capacitance C202 (accumulation of electric charge; see C202 in FIG. 7) between the source line SB112 and a source line SR161, transfers to (jumps into) the source line SB112, thereby changing the electric potential of the source line SB112.

FIG. 6 schematically shows (i) the change in electric potential of the source line SB106 from the time t1 on, and (ii) the change in electric potential of the source line SB112 from the time t2 on (see the electric potential change indicated by the arrows in FIG. 6).

Thus, when simultaneously selecting all the groups in one block—for example, the groups Gr154 and Gr155 in the block B158, or the groups Gr156 and Gr157 in the block B159—during the odd-numbered frame period or the even-numbered frame period, parasitic capacitance (such as the parasitic capacitance C201 or C202) occurs between two source lines (like between the source lines SB106 and SR107, or between the source lines SB112 and SR161) which belong to respective different groups, and which are disposed at a "boundary" between the groups adjacent to each other such as the groups Gr155 and Gr156. The parasitic capacitance causes the changes in electric potential of end portions of the source lines (SB106 and SB112), each of the end portions being opposite to a selection direction (i.e., a direction in which the sampling switches shift).

This causes the display section 195 to have display unevenness, in a vertical-striped manner, which is enhanced for every block (for the block B158, and for the block B159), i.e., for every six source lines or for every two pixels.

SUMMARY OF THE INVENTION

The present invention is made to solve the foregoing conventional problems, and its object is to provide a signal circuit and a liquid crystal display apparatus for uniformizing, over an entire display section, changes in electric potential of source lines due to parasitic capacitance so that it is difficult for display unevenness having a vertical-striped shape to be noticeable due to the change in electric potential.

To achieve the object, a signal circuit of the present invention includes: (1) a plurality of signal sources; (2) a plurality of data lines to which the signal sources supply signals, respectively; and (3) driving means for driving the data lines, the data lines being divided into a plurality of groups, each of the groups including at least one data line, adjacent groups in the groups constituting one block, the signal sources supplying the signals, at same timing, to the data lines that belong to a group selected by the driving means, respectively, wherein: the driving means selects groups which belong to a clump of blocks including a first block, and a second block adjacent to the first block so that: (i) during a first predetermined period, the driving means simultaneously selects groups that belong to the first block, and simultaneously selects groups that belong to the second block, and (ii) during a second predetermined period subsequent to the first predetermined period, the driving means selects groups one by one from groups disposed at respective ends of the clump of blocks, simultaneously selects adjacent groups that belong to different blocks, and selects remaining groups one by one.

According to the arrangement, the data lines of the groups which belong to a clump of blocks including the first block, and the second block adjacent to the first block are driven as follows.

Firstly, the driving means simultaneously selects a plurality of groups (hereinafter, referred to as "a first start group through a first terminal group" in this order in a scanning direction) that belong to the first (arbitrary) block. On this occasion, the signals are supplied, at the same timing, from the signal sources to the respective data lines provided in the first start group through the first terminal group. Then, the driving means simultaneously selects all of the groups (hereinafter, referred to as "a second start group through a second terminal group" in this order in the scanning direction) that belong to the second block adjacent to the first block. The signals are supplied, at the same timing, from the signal sources to the respective data lines provided in the second start group through the second terminal group.

Next, during the second predetermined period subsequent to the first predetermined period, the data lines of the groups that belong to the clump of blocks are driven as follows.

Firstly, the first start group disposed at an end of the clump of blocks is selected, and the signals are supplied, at the same timing, to respective data lines provided in the first start group. After that, the groups are selected one by one up to the group which is one group before the first terminal group, and the signals are supplied, at the same timing, to respective data lines provided in the selected group. Then, the first terminal group and the second start group are simultaneously selected, and the signals are supplied, at the same timing, to respective data lines provided in the first terminal group and the second start group. Thereafter, the remaining groups, i.e., the groups provided from the next group of the second start group to the second terminal group are selected one by one, and the signals are supplied, at the same timing, to respective data lines provided in the remaining groups.

Namely, during the second predetermined period, simultaneously selected are only the first terminal group and the second start group which belong to different blocks and are adjacent to each other, and the remaining groups are selected one by one from the first start group which is disposed at one end of the clump of blocks.

The groups are selected in the above-described manner. This causes the data lines to be driven (i.e., causes the signals to be supplied from the signal sources). On this account, the following effect is obtained.

Firstly, during the first predetermined period, a plurality of the groups that belong to the first block are simultaneously selected, and the signals are supplied, at the same timing, from the signal sources to the respective data lines (hereinafter, referred to as "a start data line through a terminal data line" in the scanning direction) provided in each of the groups of the first block. At the moment, not selected are the respective data lines (hereinafter, referred to as "a start data line through a terminal data line" in the scanning direction) provided in each of the groups of the second block.

Namely, the terminal data line of the first terminal group receives new signal electric potential, whereas the start data line of the second start group adjacent to the first terminal group keeps signal electric potential which the start data line has received before. This causes an electric potential difference between the terminal data line of the first terminal group and the start data line of the second start group, thereby causing parasitic capacitance (accumulation of electric charge) to occur between the terminal data line and the start data line.

Then, the groups that belong to the second block are simultaneously selected, and the start data line of the second start group receives new signal electric potential. This causes the reduction of the electric potential difference between the data lines (i.e., between the start data line of the second start group and the terminal data line of the first terminal group). This causes the electric charge accumulated in the parasitic capacitance to transfer to (jump into) the terminal data line of the first terminal group, thereby causing the change in electric potential in the terminal data line of the first terminal group. Similarly, a change in electric potential occurs in the terminal data line of the second terminal group.

As such, during the first predetermined period, the change in electric potential occurs in the terminal data line of the terminal group of each block.

During the second predetermined period, only the first terminal group and the second start group are simultaneously selected, and the remaining groups are selected one by one. When the groups are thus selected one by one, the change in electric potential occurs in the terminal data line of the group which had been selected one group before the group which was selected. This is because, when a group was selected, the parasitic capacitance, between the start data line of the group which was selected and the terminal data line of the group which had been selected one group before the group which was selected, causes the change in electric potential in the terminal data line of the group which had been selected one group before the group which was selected.

It should be noted that, because only the first terminal group and the second start group are simultaneously selected, the change in electric potential does not occur in the terminal data line of the first terminal group. It should be also noted that the change in electric potential does not occur in the terminal data line of the second terminal group that is selected last.

As such, during the second predetermined period, apart from the terminal groups in the respective blocks, the change in electric potential occurs in each terminal data line of the groups.

Therefore, when a combination of an odd-numbered frame and an even-numbered frame is regarded as one period (for example, an odd-numbered frame and an even-numbered frame), the terminal data lines of the respective groups have a uniform change in electric potential during such one period.

Accordingly, for example, in cases where the data line is used as a source line for writing a signal (electric potential) in a pixel of a display apparatus, it is possible to avoid the adverse effect causing only terminal data lines of specific groups to have changes in electric potential, respectively, during the first and second predetermined periods. Accordingly, it is possible to avoid the adverse effect causing the display unevenness having a vertical-striped shape to be enhanced for every several data lines (for every several pixels). This allows the display unevenness not to be noticeable over the entire display screen (to be difficult to visually recognize), thereby improving display quality.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
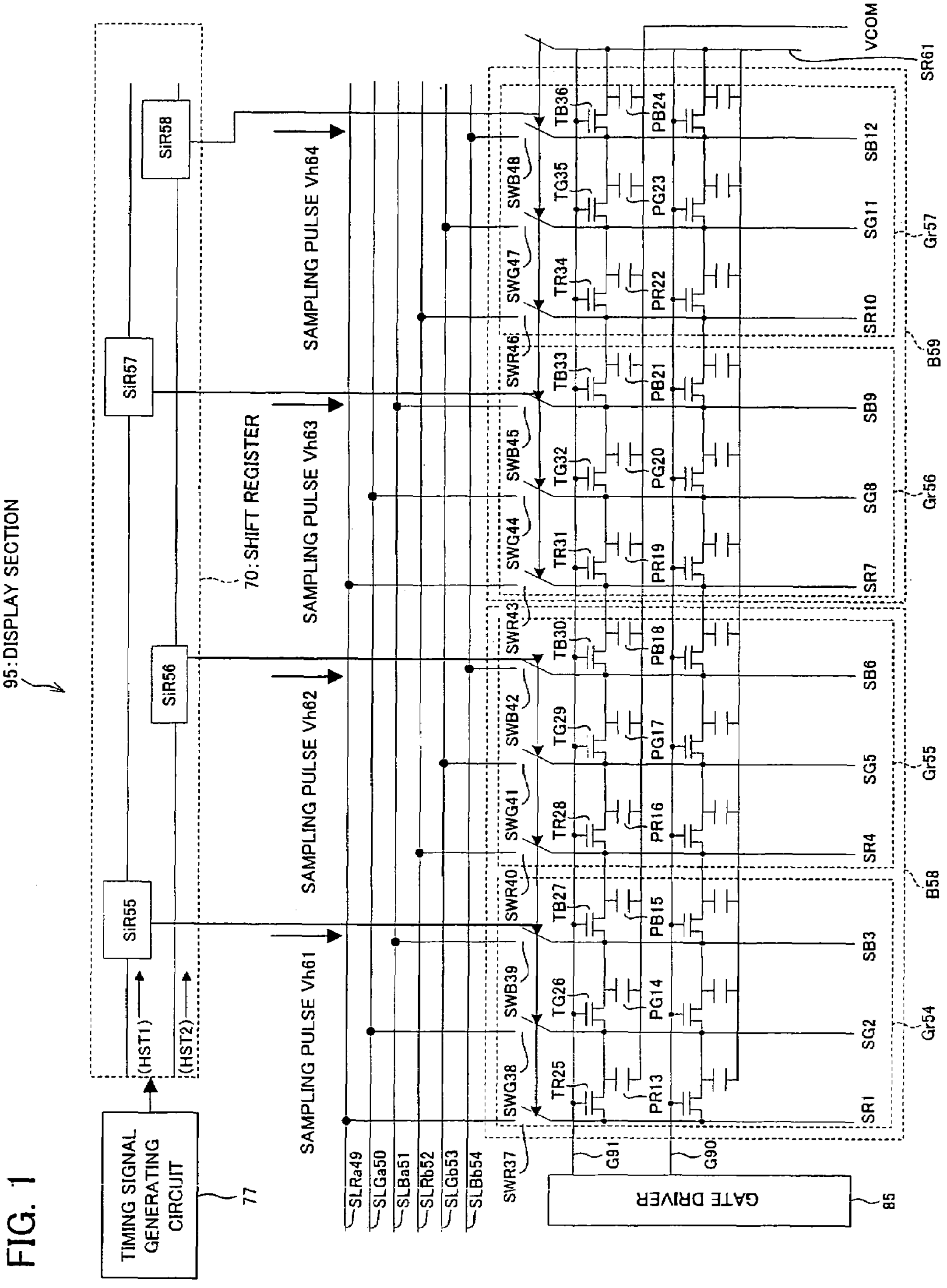
FIG. 1 is a block diagram illustrating a display section of a liquid crystal display apparatus in accordance with the present invention.

FIG. 1 is a block diagram illustrating a display section of a liquid crystal display apparatus in accordance with the present invention.

As shown in FIG. 1, a display section 95 (signal circuit) includes (i) a control circuit (not shown); (ii) a gate driver 85; (iii) a timing signal generating circuit 77 (driving means); (iv) a shift register 70 (driving means) including output stages SiR55 through SiR58; (v) signal lines (signal sources) SLRa49 through SLBa51 (first signal channel; first through third signal sources) and signal lines (signal sources) SLRb52 through SLBb54 (second signal channel; fourth through sixth signal sources); (vi) a plurality of gate lines G90, G91, . . . ; (vii) a plurality of source lines (data lines) SR1 through SB12 (first through twelfth source lines, and first through twelfth data lines); (viii) sampling switches SWR37 through SWB48 (driving means) that serve as a switching element such as an analog switch; (ix) thin film transistors TR25 through TB36 (switching device); and (x) pixel capacitance PR13 through PB24 (pixels).

The gate lines G90, G91, . . . , in a row direction and the source lines SR1 through SB12 in a column direction are provided so as to intersect with each other in a matrix manner. For example, the thin film transistors TR25 through TB36 (switching element) are provided at respective points where the gate line G91 intersects with the source lines SR1 through SB12, respectively. Further, the thin film transistors TR25 through TB36 have (i) gates connected to the gate line G91, respectively, and (ii) sources connected to the source lines SR1 through SB12, respectively, and (iii) drains each connected to one electrode of the respective pixel capacitance PR13 through PB24. Note that each of the other electrodes of the pixel capacitance PR13 through PB24 is connected to a common voltage (VCOM).

R, G, and B in the reference symbols correspond to Red, Green, and Blue, respectively. For example, SR indicates a source line that corresponds to red. PR indicates pixel capacitance that corresponds to red. SLR indicates a signal line that corresponds to red. In the present embodiment, order of colors that correspond to source lines in each block (for example, the source lines SR1 through SB6 in a block 58) is R, G, B, R, G, and B.

The gate driver 85 outputs sampling pulses (selection signal) for the gate lines G90, G91, . . . , in accordance with a vertical signal or the like which is sent from the control circuit (not shown). This allows the gate lines G90, G91, . . . , to be sequentially driven (selected).

The timing signal generating circuit 77 outputs two kinds of start pulses HST1 and HST2 in accordance with a horizontal signal or the like which is sent from the control circuit. The start pulse HST1 is supplied to the output stages SiR55 and SiR57 of the shift register 70, and the start pulse HST2 is supplied to the output stages SiR56 and SiR58. The output stages 55 through 58 of the shift register 70 outputs sampling pulses Vh61 through Vh64 in accordance with the start pulses HST1 and HST2, respectively. The sampling pulses Vh61 through Vh64 control ON/OFF of the sampling switches SWR37 through the SWB48.

Further, in synchronization with the sampling pulses Vh61 through Vh64, signals of the independent two channels (a-channel, and b-channel) are outputted. Specifically, from the signal lines SLRa49 through SLBa51, a-channel signals that correspond to R, G, and B, respectively are outputted. Also, from the signal lines SLRb52 through SLRb54, b-channel signals that correspond to R, G, and B, respectively are outputted.

The source lines SR1 through SB12 are divided into four groups Gr54, Gr55, Gr56, and Gr57 so that each group is constituted by three source lines which correspond to one pixel. Further, one block such as the block B58 or B59 is constituted by two groups (which correspond to two pixels) adjacent to each other. Further, the source lines SR1 through SB12 are connected to the signal lines SLRa49 through SLBb54, via the sampling switches SWR37 through SWB48, respectively.

Specifically, in the group Gr54, the three source lines SR1, SG2, and SB3 are connected to the signal lines SLRa49, SLGa50, and SLBa51 of the a-channel, via the sampling switches SWR37, SWG38, and SWB39, respectively.

Further, in the group Gr54, the three sampling switches SWR37 through SWB39 are connected to the output stage SiR55 of the shift register 70. Each ON/OFF of the sampling switches SWR37 through SWB39 is controlled by the sampling pulse Vh61, which is sent from the output stage SiR55. The a-channel signals are sent from the signal lines SLRa49 through SLBa51 in response to the sampling pulse Vh61 (i.e., in response to the ON/OFF of the sampling switches SWR37 through SWB39), respectively. The a-channel signals are written in the source lines SR1 through SB3, respectively.

In the group Gr55, the three source lines SR4, SG5, and SB6 are connected to the signal lines SLRb52, SLGb53, SLBb54 of the b-channel, via the sampling switches SWR40, SWG41, and SWB42, respectively.

In the group Gr55, the three sampling switches SWR40 through SWB42 are connected to the output stage SiR56 of the shift register 70. Each ON/OFF of the sampling switches SWR40 through SWB42 is controlled in response to the sampling pulse Vh62, which is sent from the output stage SiR56. The b-channel signals are sent from the signal lines SLRb52 through SLBb54 in response to the sampling pulse Vh62 (i.e., in response to the ON/OFF of the sampling switches SWR40 through SWB42), respectively. The b-channel signals are written in the source lines SR4 through SB6, respectively.

The groups Gr54 (a-channel) and Gr55 (b-channel) adjacent to each other constitute the block B58.

Similarly, in the group Gr56, the three source lines SR7, SG8, and SB9 are connected to the signal lines SLRa49, SLGa50, and SLBa51 of the a-channel, via the sampling switches SWR43, SWG44, and SWB45, respectively.

Further, in the group Gr56, the three sampling switches SWR43 through SWB45 are connected to the output stage SiR57 of the shift register 70. Each ON/OFF of the sampling switches SWR43 through SWB45 is controlled in response to the sampling pulse Vh63 which is sent from the output stage SiR57. The a-channel signals are sent from the signal lines SLRa49 through SLBa51 in response to the sampling pulse Vh63 (i.e., in response to the ON/OFF of the sampling switches SWR43 through SWB45), respectively. The a-channel signals are written in the source lines SR7 through SB9, respectively.

In the group Gr57, the three source lines SR10, SG11, and SB12 are connected to the signal lines SLRb52, SLGb53, SLBb54 of the b-channel, via the sampling switches SWR46, SWG47, and SWB48, respectively.

In the group Gr57, the three sampling switches SWR46 through SWB48 are connected to the output stage SiR58 of the shift register 70. Each ON/OFF of the sampling switches SWR46 through SWB48 is controlled in response to the sampling pulse Vh64, which is sent from the output stage SiR58. The b-channel signals are sent from the signal lines SLRb52 through SLBb54 in response to the sampling pulse Vh64 (i.e., in response to the ON/OFF of the sampling switches SWR46 through SWB48), respectively. The b-channel signals are written in the source lines SR10 through SB12, respectively.

The group Gr56 (a-channel), and the group Gr57 (b-channel) adjacent to each other constitute the block B59.

Figure 3:
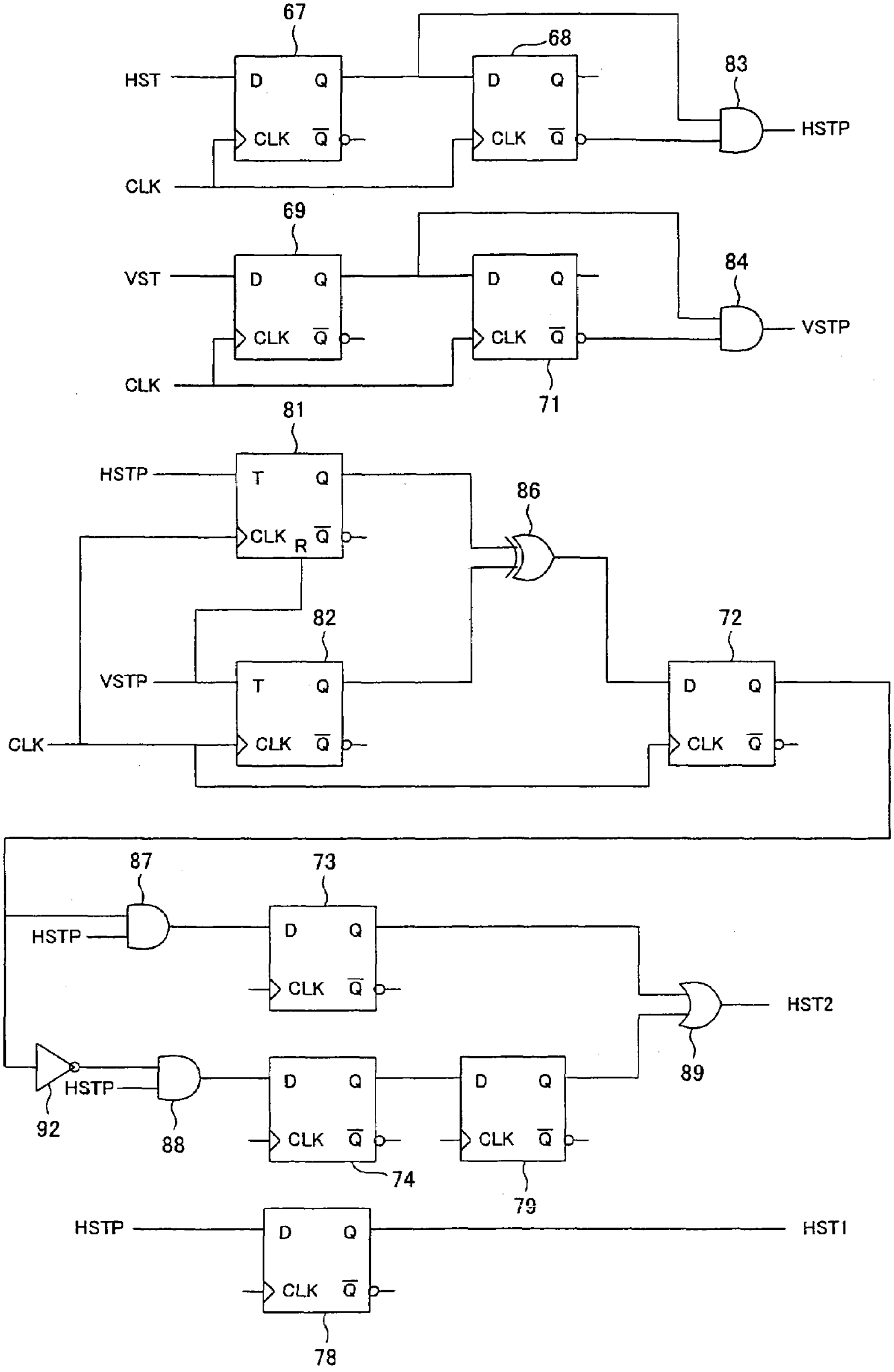
FIG. 3 is a block diagram illustrating a timing signal generating circuit of the liquid crystal display apparatus in accordance with the present invention.

FIG. 3 is a block diagram illustrating the timing signal generating circuit 77 (flip-flop circuit) for generating the two types of the start pulses HST1 and HST2.

As shown in FIG. 3, the timing signal generating circuit 77 includes: (i) nine D-type flip-flop circuits DFF67 through DFF69, DFF71 through DFF74, DFF78 and DFF79; (ii) two T-type flip-flop circuits TFF81 and TFF82; (iii) four AND gates 83, 84, 87, and 88; (iv) an exclusive-OR gate 86; (v) an OR gate 89; and (vi) an inverter 92. Note that outputs of the six logic circuits (i) through (vi) are indicated by f83, f84, f87 and f88 for the AND gates; f86 for the Exclusive-OR gate; f89 for the OR gate, respectively. Note also that, in the following description, not only input signals but also a clock CLK are inputted to the flip-flop circuits, respectively.

Firstly, a first input pulse (horizontal start pulse) HST is supplied to the D-type flip-flop circuit DFF67. Then, an output signal from the D-type flip-flop circuit DFF67 is supplied to the D-type flip-flop circuit DFF68. An inverted output signal of the D-type flip-flop circuit DFF68 is supplied to one input terminal (first input terminal) of the AND gate 83. Further, the output signal of the D-type flip-flop circuit DFF67 is also supplied to another input terminal (second input terminal) of the AND gate 83. The AND gate 83 outputs the output signal f83 as an output pulse HSTP.

A second input pulse (vertical start pulse) VST is supplied to the D-type flip-flop circuit DFF69. An output signal from the D-type flip-flop circuit DFF69 is supplied to the D-type flip-flop circuit DFF71. An inverted output signal of the D-type flip-flop circuit DFF71 is supplied to one input terminal of the AND gate 84 (first input terminal of the AND gate 84). Further, the output signal of the D-type flip-flop circuit DFF69 is also supplied to another input terminal (second input terminal) of the AND gate 84. This allows the AND gate 84 to output the output signal f84 (VSTP).

The output signal f83 (HSTP) is supplied to the T-type flip-flop circuit TFF81. The output signal f84 (VSTP) is supplied to the T-type flip-flop circuit TFF81 as a reset signal. An output signal of the T-type flip-flop circuit TFF81 is supplied to one input terminal (first input terminal) of the Exclusive-OR gate 86. The output signal f84 is also supplied to the T-type flip-flop circuit TFF82. An output signal of the T-type flip-flop circuit TFF82 is supplied to another input terminal (second input terminal) of the Exclusive-OR gate 86. This allows the Exclusive-Or gate 86 to output the output signal f86.

The output signal f86 is supplied to the D-type flip-flop circuit DFF72. An output signal of the D-type flip-flop circuit DFF72 is supplied to one input terminal (first input terminal) of the AND gate 87. Further, the first output pulse HSTP is supplied to another input terminal (second input terminal) of the AND gate 87. This allows the AND gate 87 to output the output signal f87. Further, an output signal of the D-type flip-flop circuit DFF72 is supplied to one input terminal (first input terminal) of the AND gate 88, via the inverter 92. The first output pulse HSTP is supplied to another input terminal (second input terminal) of the AND gate 88. This allows the AND gate 88 to output the output signal f88.

The output signal f87 is supplied to the D-type flip-flop circuit DFF73. An output signal of the D-type flip-flop circuit DFF73 is supplied to one input terminal (first input terminal) of the OR gate 89. The output signal f88 is supplied to the D-type flip-flop circuit DFF74. An output signal of the D-type flip-flop circuit DFF74 is supplied to the D-type flip-flop circuit DFF79. An output of the D-type flip-flop circuit DFF79 is supplied to another input terminal (second input terminal) of the OR gate 89. This allows the OR gate 89 to output the output signal f89 as the start pulse HST2 (see FIG. 1 and FIG. 3). Further, the output pulse HSTP is supplied to the D-type flip-flop circuit DFF78. This allows the D-type flip-flop circuit DFF 78 to output the start pulse HST1 (see FIG. 1 and FIG. 3).

The following description deals with how the display section 95 is driven, in detail.

Figure 2:
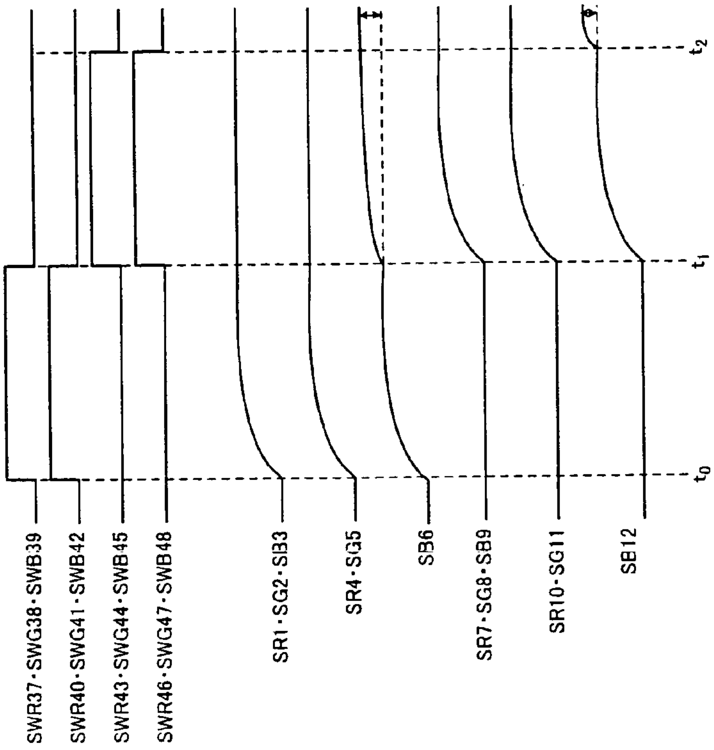
FIG. 2(*a*) and FIG. 2(*b*) are explanatory diagrams illustrating (i) timing of ON/OFF of sampling switches of the liquid crystal display apparatus of the present invention, and (ii) changes in electric potential of respective source lines.
Figure 2:
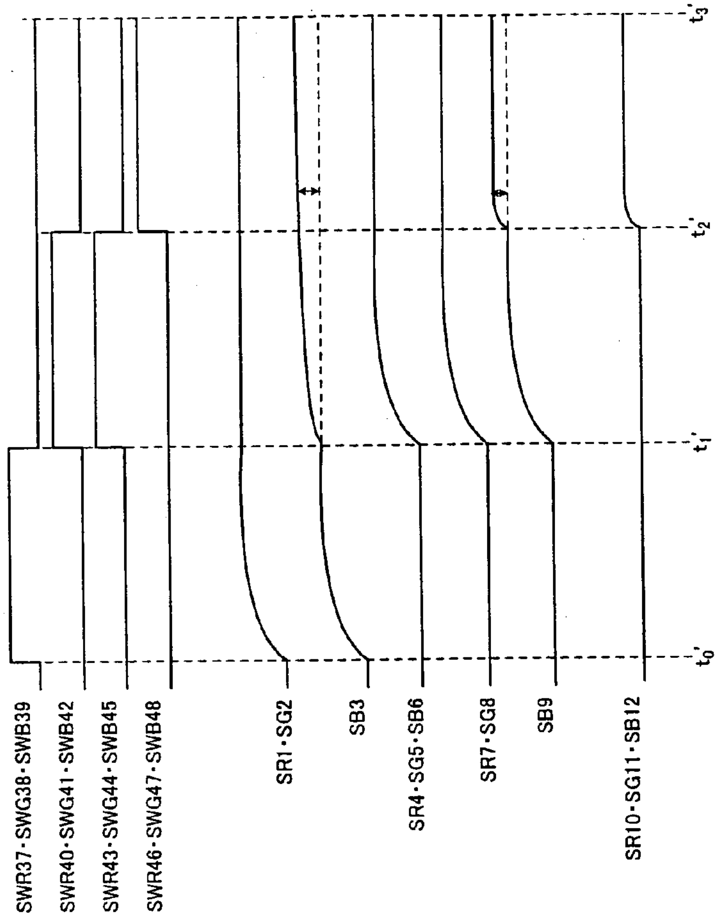

FIG. 2(*a*) shows, during an odd-numbered frame period in the display section 95, a timing chart of the twelve sampling switches SWR37 through SWR48 that belong to the blocks 58 and 59, each of which corresponds to two pixels. FIG. 2(*a*) also shows, during the odd-numbered frame period, electric potential states (states in which signals are written in the twelve source lines SR1 through SB12) of the twelve source lines SR1 through SB12 which belong to the blocks 58 and 59, and which correspond to four pixels.

Further, FIG. 2(*b*) shows, during an even-numbered frame period in the display section 95, a timing chart of the twelve sampling switches SWR37 through SWR48 that belong to the blocks 58 and 59, each of which corresponds to two pixels. FIG. 2(*b*) also shows, during the even-numbered frame, electric potential states (states in which signals are written in the twelve source lines SR1 through SB12) of the twelve source lines SR1 through SB12 which belong to the blocks 58 and 59, and which correspond to four pixels.

Note that the term "frame period" indicates a period of time (a scanning period that corresponds to one screen) required for scanning all the gate lines G90, . . . , in the display section 95. For example, in cases where a display screen is rewritten sixty times per second, 1/60 second corresponds to one frame. Here, it is assumed (i) that each of a first period for rewriting the display screen, a third period for rewriting the display screen, a fifth period for rewriting the display screen, . . . , is referred to as an odd-numbered frame period, and (ii) that each of a second period for rewriting the display screen, a fourth period for rewriting the display screen, a sixth rewriting period, . . . , is referred to as an even-numbered frame period. It is also assumed (a) that each of the display screens (display section 95) that have been subject to the first rewriting, the third rewriting, the fifth rewriting, . . . , is referred to as an odd-numbered frame, and (b) that each of the display screens (display section 95) that have been subject to the second rewriting, the fourth rewriting, the sixth rewriting, is referred to as an even-numbered frame.

As shown in FIG. 2(*a*), during the odd-numbered frame period, the sampling switches SWR37 through SWB42 of the group Gr54 and Gr55 that belong to the block B58 are simultaneously selected (turned ON) at time t0, in synchronization with a timing signal (not shown) supplied from the timing circuit 77.

Then, during a period of time from the time t0 to time t1, signals which are supplied via the signal lines SLRa49 through SLBb54 are respectively written, at the same timing, in the pixel capacitance PR13 through PB18, via the source lines SR1 through SB6 connected to the sampling switches SWE37 through SWE42, respectively.

Note that, during the period of time from the time t0 to the time t1, the sampling switches SWR43 through SWB48 of the groups Gr56 and Gr57 that belong to the block B59 are turned OFF, respectively. As such, each of the source lines SR7 through SB12, which are connected to the sampling switches SWR43 through SWB48, keeps electric potential which was written one horizontal period (a scanning period that corresponds to one gate line) ago.

Thereafter, the sampling switches SWR37 through SWB42 of the groups Gr54 and Gr55 that belong to the block 58 are simultaneously turned OFF, in synchronization with a timing signal (not shown) received at the time t1 which is one clock (one cycle) after the time t0. On this occasion, simultaneously selected (turned ON) are the sampling switches SWR43 through SWB48 of the groups Gr56 and Gr57 that belong to the block 59.

Then, during the period of time from the time t1 to time t2, signals which are supplied via the signal lines SLRa49 through SLBb54 are written, at the same timing, in the pixel capacitance PR19 through PB24, via the source lines SR7 through SB12 connected to the sampling switches SWE37 through SWE42, respectively.

Further, as shown in FIG. 2(*b*), during the even-numbered frame period, the sampling switches SWR37 through SWB39 of the group Gr54 that belongs to the block B58 are simultaneously selected (turned ON) at time t0', in synchronization with a timing signal (not shown) supplied from the timing circuit 77.

Then, during the period of time from the time t0' to time t1', signals which are supplied via the signal lines SLRa49 through SLBb51 are written, at the same timing, in the pixel capacitance PR13 through PB15, via the source lines SR1 through SB3 connected to the sampling switches SWE37 through SWE39, respectively.

Note that, during the period of time from the time t0' to the time t1', turned OFF are the sampling switches SWR40 through SWB42 of the group Gr55 that belongs to the block B58, and the sampling switches SWR43 through SWB48 of Gr56 and Gr57 that belong to the block B59. As such, each of the source lines SR4 through SB6 (the group Gr55) and the source lines SR7 through SB12 (the block B59) connected to the corresponding sampling switches keeps electric potential which was written one horizontal period (a scanning period that corresponds to one gate line) ago.

Thereafter, the sampling switches SWR37 through SWB39 of the groups Gr54 that belongs to the block 58 are simultaneously turned OFF, in synchronization with a timing signal (not shown) that is received at the time t1' which is one clock (one cycle) after the time t0'. On this occasion, simultaneously selected (turned ON) are the sampling switches SWR40 through SWB45 of the groups Gr55 and Gr56, which belong to the blocks 58 and 59, respectively.

Then, during the period of time from the time t1' to time t2', signals which are supplied via the signal lines SLRb52 through SLBb54, and via SLRa49 through SLBa51 are written, at the same timing, in the pixel capacitance PR 16 through PB21, via the source lines SR4 through SB9 connected to the sampling switches SWE40 through SWE45, respectively.

Note that, during the period of time from the time t1' to the time t2', turned OFF are the sampling switches SWR46 through SWB48 of the group Gr57 that belongs to the block B59. As such, each of the source lines SR10 through SB12, which are respectively connected to the sampling switches SWR46 through SWB48, keeps electric potential which was written one horizontal period (a scanning period that corresponds to one gate line) ago.

Thereafter, the sampling switches SWR40 through SWB45 of the groups Gr55 and Gr56, which belong to the blocks 58 and 59, respectively, are simultaneously turned OFF, in synchronization with a timing signal (not shown) that is received at the time t2' which is one clock (one cycle) after the time t1'. On this occasion, simultaneously selected (turned ON) are the sampling switches SWR46 through SWB48 of the groups Gr57 that belong to the block 59.

Then, during the period of time from the time t2' to time t3', signals which are supplied via the signal lines SLRb52 through SLBb54 are written, at the same timing, in the pixel capacitance PR22 through PB24, via the source lines SR10 through SB12 connected to the sampling switches SWE46 through SWE48, respectively.

Figure 4:
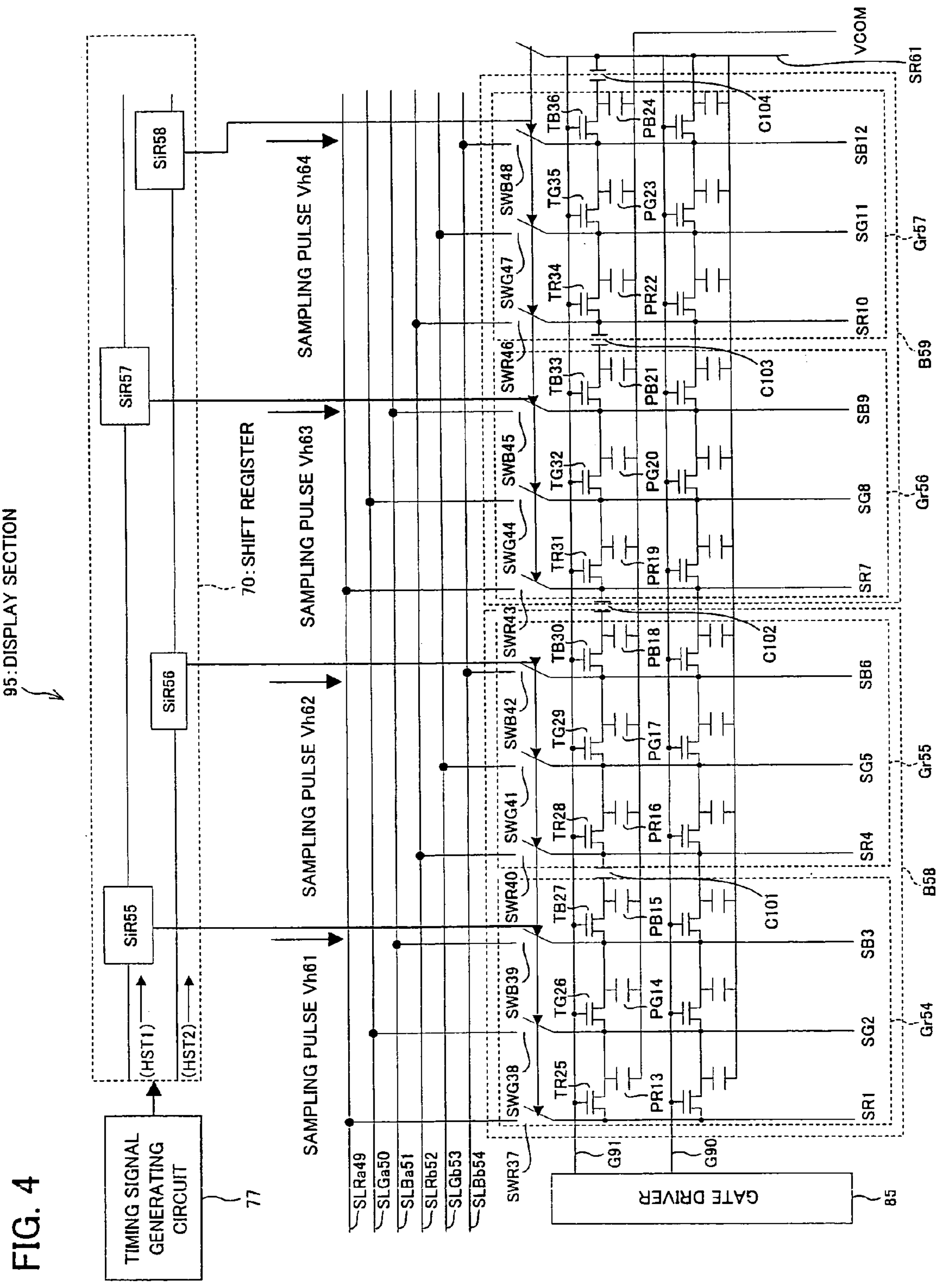
FIG. 4 is an explanatory block diagram illustrating parasitic capacitance existing in the display section of the liquid crystal display apparatus in accordance with the present invention.
Figure 5:
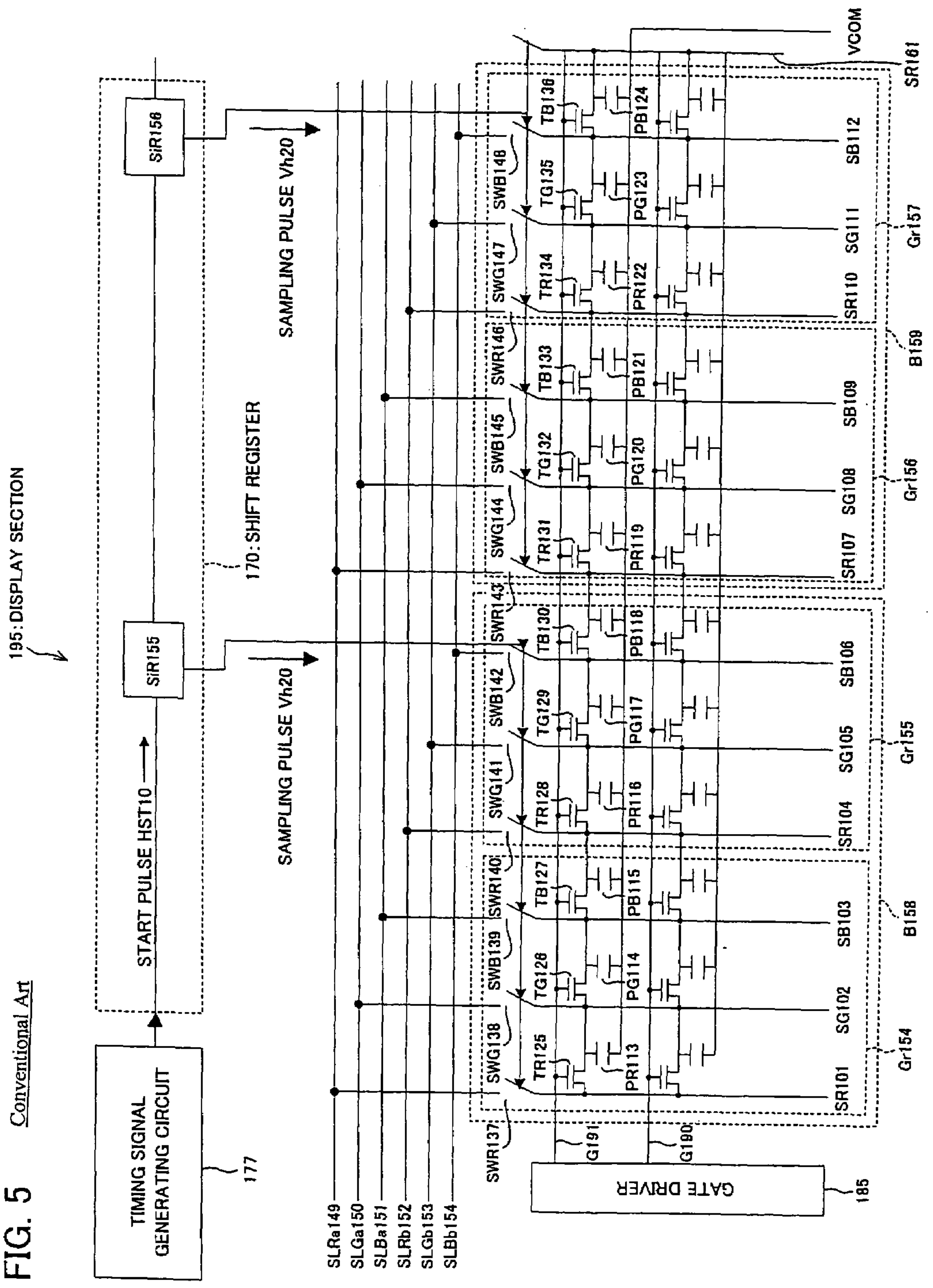
FIG. 5 Conventional Art
FIG. 5 is a block diagram illustrating a display section of a conventional liquid crystal display apparatus.

With the driving method, when a combination of an odd-numbered frame and an even-numbered frame is regarded as one display screen, it is possible to uniformize, over the entire display section 95 (i.e., over the entire display screen), the change in electric potential caused by the parasitic capacitance of the source lines SB3, SB6, SB9, and SB12 which correspond to B (blue), so that it is difficult for display unevenness having a vertical-striped shape to be recognized due to the electric potential changes. This will be described as follows. Note that FIG. 4 schematically shows the parasitic capacitance C101 through C104 of the respective source lines in the display section 95.

The following description explains the source lines SB6 and SB12 during an odd-numbered frame.

In the first place, an explanation is made with respect to the source line SB6. The sampling switch SWB42 that belongs to the block B58 is turned ON at the time t0. As such, during the period of time from the time t0 to the time t1, the source line SB6 which is connected to the sampling switch SWB42 receives a signal (electric potential) via the signal line SLBb54. In contrast, during the period of time from the time t0 to the time t1, turned OFF is the sampling switch SWR43 belonging to the block B59 that is adjacent to the block B58. The source line SR7 connected to the sampling switch SWR43 keeps electric potential that was given one horizontal period ago, accordingly. Thus, an electric potential difference becomes large between the source line SR7 and the source line SB6 (i.e., an electrode on a side of the source line SB6 of the pixel capacitance PB18), the source line SB6 receiving a new signal (electric potential), and the source line SR7 keeping the electric potential that was given one horizontal period ago. This causes the parasitic capacitance (accumulation of electric charge; see C102 in FIG. 4) to occur between the source lines SB6 and SR7.

Here, at the time t1, when the sampling switch SWR43 that belongs to the block 59 (group Gr56) is turned ON so that a signal (electric potential) is supplied to the source line SR7 connected to the sampling switch SWR43, the electric potential difference between the source line SR7 and the source line SB6 (the electrode on the side of the pixel capacitance PB18) is reduced. This causes the electric charge accumulated in the parasitic capacitance to transfer to (jumps into) the source line SB6. As such, the source line SB6 has the change in electric potential, as indicated by arrows in FIG. 2(*a*).

The source line SB12 is similar to the source line SB6. More specifically, the sampling switch SWB48 that belongs to the block B59 is turned ON at the time t1. As such, during the period of time from the time t1 to the time t2, the source line SB12 which is connected to the sampling switch SWB48 receives a signal (electric potential) via the signal line SLBb54. In contrast, during the period of time from the time t1 to the time t2, the source line SR61 adjacent to the source line SB12 keeps electric potential that was given one horizontal period ago. Thus, an electric potential difference becomes large between the source line SR61 and the source line SB12 (i.e., an electrode on a side of the pixel capacitance PB24), the source line SB12 receiving a new signal (electric potential), and the source line SR61 keeping the electric potential that was given one horizontal period ago. This causes the parasitic capacitance occurs (accumulation of electric charge; see C104 in FIG. 4) between the source lines SB12 and SR61.

Here, when the source line SR61 receives a signal (electric potential) after the time t2, reduced is the electric potential difference between the source line SR61 and the source line SB12 (the electrode on the side of the pixel capacitance PB24). On this account, the electric charge accumulated in the parasitic capacitance transfers to (jumps into) the source line SB12. This causes the source line SB12 to have the change in electric potential, as indicated by arrows in FIG. 2(*a*).

Next, the following description deals with the source lines SB3 and SB9 during an even-numbered frame.

In the first place, an explanation is made with respect to the source line SB3. The sampling switch SWB39 that belongs to the group Gr54 is turned ON at the time t0'. As such, during the period of time from the time t0' to the time t1', the source line SB3 which is connected to the sampling switch SWB39 receives a signal (electric potential) via the signal line SLBa51. In contrast, during the period of time from the time t0' to the time t1', turned OFF is the sampling switch SWR40 belonging to the group Gr55 that is adjacent to the group Gr54. As such, the source line SR4 connected to the sampling switch SWR40 keeps electric potential that was given one horizontal period ago. Thus, an electric potential difference becomes large between the source line SR4 and the source line SB3 (i.e., an electrode on a side of the pixel capacitance PB15), the source line SB3 receiving a new signal (electric potential), and the source line SR4 keeping the electric potential that was given one horizontal period ago. This causes parasitic capacitance (accumulation of electric charge; see C101 in FIG. 4) to occur between the source lines SB3 and SR4.

Here, at the time t1', when the sampling switch SWR40 that belongs to the group Gr55 is turned ON so that a signal (electric potential) is supplied to the source line SR4 connected to the sampling switch SWR40, the electric potential difference between the source line SR4 and the source line SB3 (the electrode on the side of the pixel capacitance PB18) is reduced. On this account, the electric charge accumulated in the parasitic capacitance C101 transfers to (jumps into) the source line SB3. This causes the source line SB3 to have the change in electric potential, as indicated by arrows in FIG. 2(*b*).

The source line SB9 is similar to the source line SB3. More specifically, the sampling switch SWB45 that belongs to the group Gr56 is turned ON at the time t1'. As such, during the period of time from the time t1' to the time t2', the source line SB9 which is connected to the sampling switch SWB45 receives a signal (electric potential) via the signal line SLBa51. In contrast, during the period of time from the time t1' to the time t2', turned OFF is the sampling switch SWR46 belonging to the group Gr57 adjacent to the group Gr56. As such, the source line SR10 which is connected to the sampling switch SWR46 keeps electric potential that was given one horizontal period ago. Thus, an electric potential difference becomes large between the source line SR10 and the source line SB9 (i.e., an electrode on a side of the pixel capacitance PB21), the source line SB9 receiving a new signal (electric potential), and the source line SR10 keeping the electric potential that was given one horizontal period ago. This causes the parasitic capacitance (accumulation of electric charge; see C103 in FIG. 4) to occur between the source lines SB9 and SR10.

Here, at the time t2', when the sampling switch SWR46 that belongs to the group Gr57 is turned ON so that a new signal (electric potential) is supplied to the source line SR10 connected to the sampling switch SWR46, the electric potential difference between the source line SR10 and the source line SB9 (the electrode on the side of the pixel capacitance PB21) is reduced. On this account, the electric charge accumulated in the parasitic capacitance C103 transfers to (jumps into) the source line SB9. This causes the source line SB9 to have the change in electric potential, as indicated by arrows in FIG. 2(*b*).

According to the method for driving the display section 95, during an odd-numbered frame, the source lines SB6 and SB12 have the change in electric potential, whereas, during an even-numbered frame, the source lines SB3 and SB9 have the change in electric potential. In other words, when a combination of an odd-numbered frame and an even-numbered frame is regarded as one display screen, it is possible to uniformize, over the entire display section 95 (i.e., over the entire display screen), the change in electric potential caused by the parasitic capacitance of the source lines SB3, SB6, SB9, and SB12 which correspond to B (blue).

Figure 6:
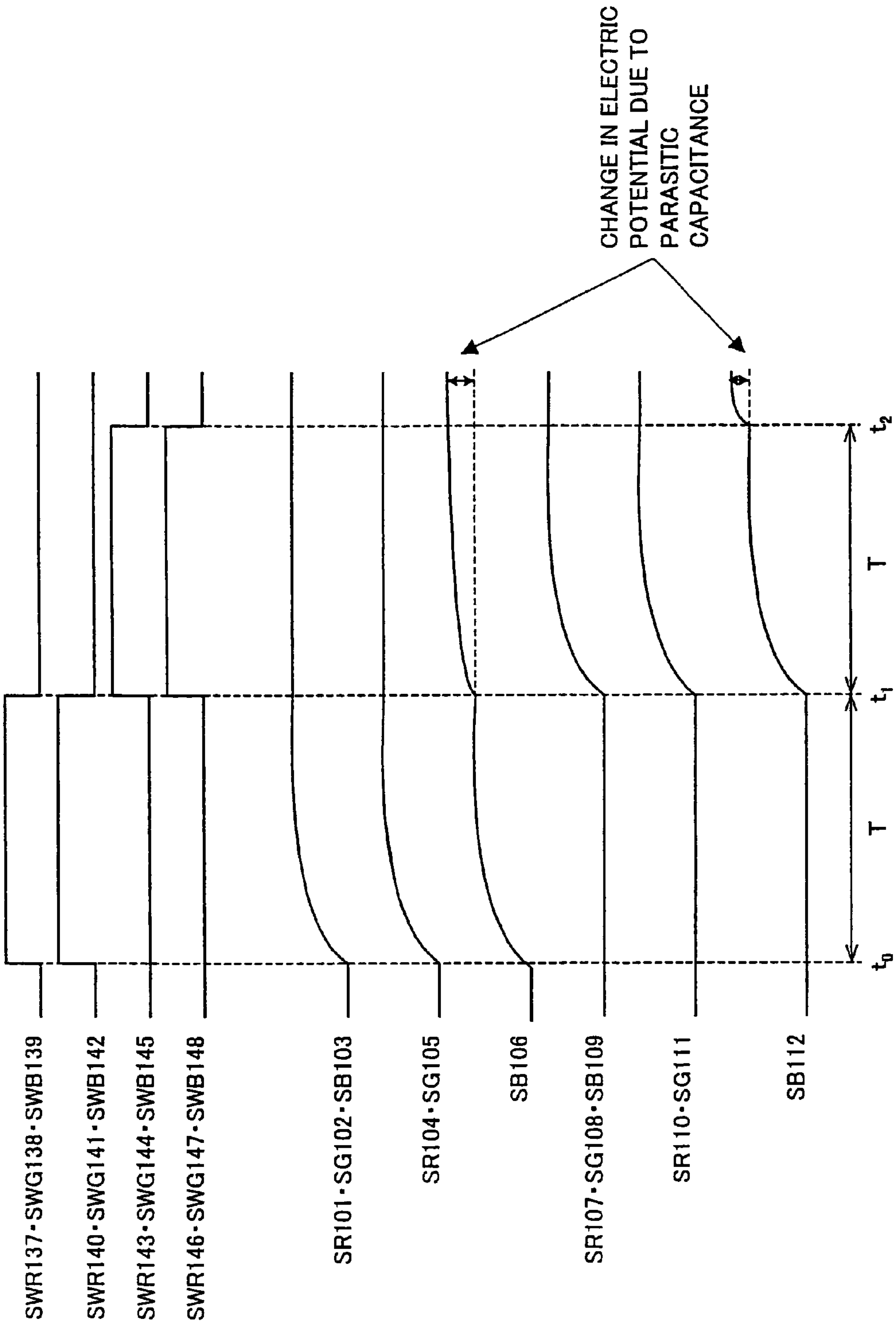
FIG. 6 Conventional Art
FIG. 6 is an explanatory diagram illustrating (i) timing of ON/OFF of sampling switches in the conventional liquid crystal display apparatus, and (ii) changes in electric potential of respective source lines.
Figure 7:
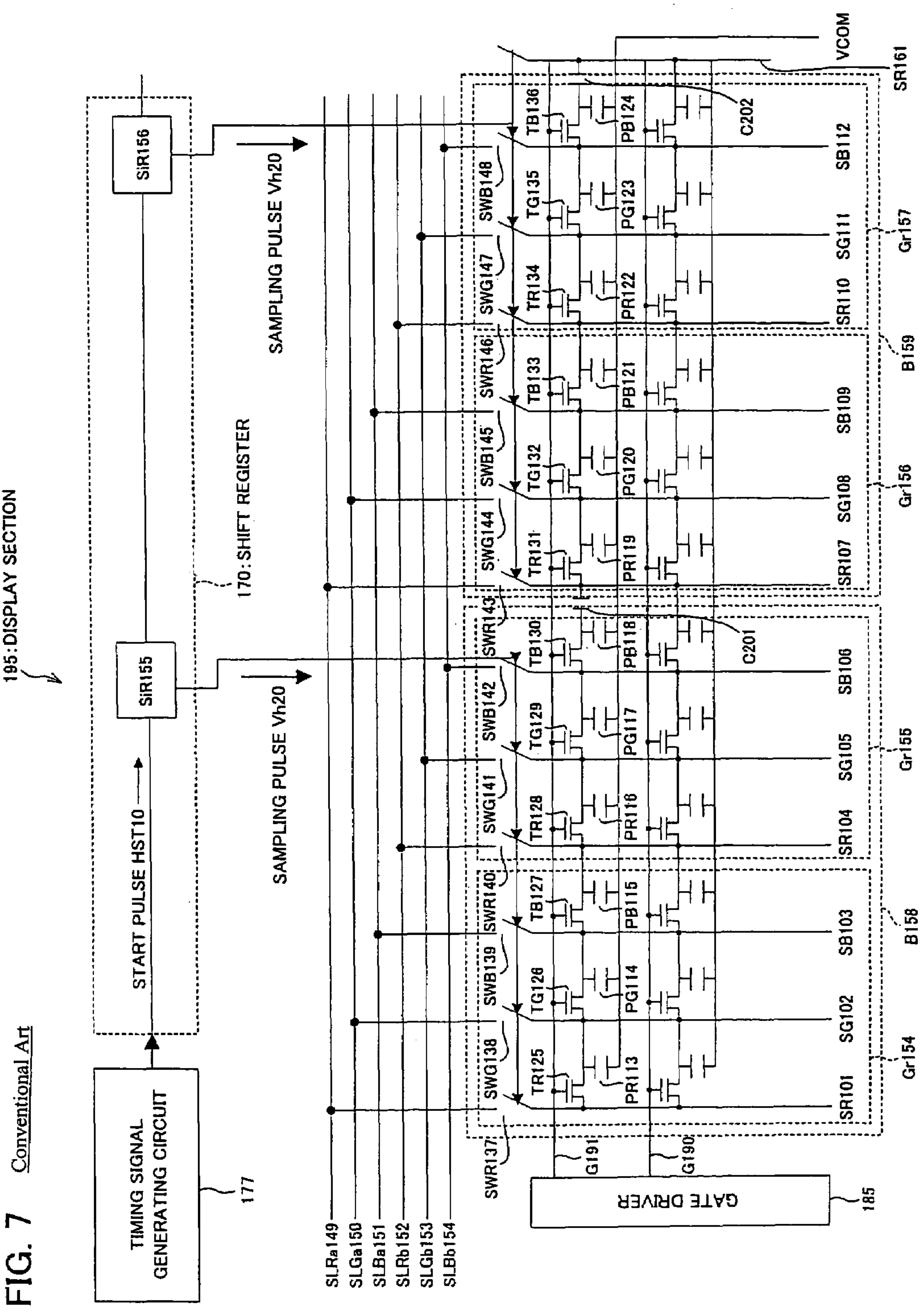
FIG. 7 Conventional Art
FIG. 7 is an explanatory block diagram illustrating parasitic capacitance existing in the display section unit of the conventional liquid crystal display apparatus.

This prevents the change in electric potential from occurring only in the same source lines, for example only in the source lines SB6 and SB12, during the odd-numbered frame and during the even-numbered frame. Accordingly, unlike the conventional driving method (see FIG. 6), display unevenness, having a vertical-striped shape which occurs for respective two pixels (i.e., six source lines), will never be enhanced.

As such, it is difficult for display unevenness having a vertical-striped shape to be recognized due to the electric potential changes caused by the parasitic capacitance occurring in association with the source lines SR1 through SB12.

Further, the display section 95 of the present embodiment is arranged so that each of the output stages SiR55 through SiR58 of the shift register 70 corresponds to the six sampling switches SWR37 through SWB48 (i.e., the six source lines SR1 through SB12). This arrangement dramatically simplifies the arrangement of the shift register 70, and then a circuit area of the shift register 70, as compared with an arrangement in which each output stage of the shift register 70 corresponds to one of the source lines SR1 through SB12.

Therefore, the effect of the display section 95 becomes more noticeable when the display section 95 (display panel) is applied to a small-sized or a medium-sized high-resolution panel, having many restrictions on outer shape and wiring pitch, such as a liquid crystal panel. Namely, it is possible to carry out displaying with high quality, in accordance with the downsizing of the panel.

Note that, in the present embodiment, the output stages SiR55 through SiR58 correspond to the three sampling switches SWR37 through SWB39, SWR40 through SWB42, SWR43 through SWB45, and SWR46 through SWB48 (i.e., the three source lines SR1 through SB3, SR4 through SB6, SR7 through SB9, SR10 through SB12), respectively. However, the present invention is not limited to this.

For example, the shift register 70 may be arranged so that each of the output stages (SiR55 through SiR58) corresponds to two sampling switches. In this case, two source lines may be provided for each group, so that four signal lines are used.

Further, in the present embodiment, the colors that correspond to the source lines (SR1, SG2, SB3, . . . ) are R, G, and B, in this order. However, the present invention is not limited to this. For example, the source lines SR1, SG2, and SB3 may correspond to G, R, and B, respectively. Further, it is preferable that the source lines (SB3, SB6, SB9, and SB12) disposed at respective ends in their groups (Gr54, Gr55, Gr56, and Gr57) correspond to the color of B (blue). However, the present invention is not limited to this.

Note that the signal circuit of the present invention may be arranged so that one source line (data line) is provided for each group, so that two signal lines (two signal sources) are used.

Namely, the signal circuit of the present invention may include: (i) two signal lines (two signal sources), (ii) a plurality of source lines (data lines) to which signals are supplied from the source lines, (iii) driving means for driving the source lines (data lines), the source lines being divided into a plurality of groups, and each of the groups including one data line, adjacent groups constituting one block that includes two source lines, the signal sources supplying the signals, at same timing, to the data lines that belong to a group selected by the driving means, respectively, wherein: the driving means selects groups which belong to a clump of blocks including a first block, and a second block adjacent to the first block so that, (i) during an odd-numbered period (first predetermined period), the driving means simultaneously selects groups that belong to the first block, and simultaneously selects groups that belong to the second block, and (ii) during an even-numbered period (second predetermined period) subsequent to the first predetermined period, the driving means selects groups one by one from groups disposed at respective ends of the clump of blocks, simultaneously selects adjacent groups that belong to different blocks, and selects remaining groups one by one.

With the arrangement, each of the first and second blocks has two groups (two source lines) that correspond to the two signal lines, respectively. During the odd-numbered frame period (first predetermined period), simultaneously selected are the two groups (two source lines) belonging to the first block. Then, simultaneously selected are two groups (two source lines) belonging to the second block adjacent to the first block. During the succeeding even-numbered frame period (second predetermined period), firstly selected is the first group (a source line disposed at an end of the one block) disposed at an end of the clump of blocks including the first through fourth groups in the scanning direction, and then selected are the second and third groups (two source lines) next to the first group, and then selected is the fourth group (a source line) next to the third group. Thus, the selections of the groups are sequentially carried out.

In the arrangement, it is preferable that the driving means includes a shift register having the output stages, and sampling switches provided in the respective source lines. In this case, an arrangement may be possible in which one output stage of the shift register corresponds to one sampling switch (one source line).

Note that, in the present embodiment, it is assumed that the signals sent via the signal lines SLRa49 through SLBb54 are analog signals. As such, during the odd-numbered frame, it is preferable that signals of b-channel (signal lines SLRb52 through SLRb54) are delayed by amount corresponding to one clock, and then are outputted from the signal source side. In this regard, even if a D/A converter is built in a liquid crystal display apparatus in future so that a receipt of digital video signal can be made, it becomes easy for a driver to include a circuit for carrying out the delaying by the amount corresponding to one clock, by providing a D-type flip flop circuit.

Note that it is possible to describe the present invention as a liquid crystal display apparatus including video signal lines (SLRa49, . . . , SLRb52, . . . ) for individually inputting video signals of two-channel (a-channel and b-channel), and adopting a point-at-a-time driving method for carrying out a point-at-a-time driving with respect to pixels in every column of a pixel section (display section) 95 in which pixels (the transistors TR25 through TB36, and the pixel capacitance PR13 through PB24) are provided in a matrix manner, the liquid crystal display apparatus further including: (1) a group of sampling switches (SWR37 through SWR48) provided between the signal lines provided (wired) in every row of the pixels and the respective video signal lines of the two-channel, and (2) driving means (the timing signal generating circuit 77, the shift register, or the like) that drives the sampling switches so that a combination of the sampling switches (SWR37 through SWR48) to be sampled at same timing is shifted in accordance with an order of the display frames (the odd-numbered frame and the even-numbered frame).

The present invention is not limited to the embodiments above, but may be altered within the scope of the claims. An embodiment based on a proper combination of technical means disclosed in different embodiments is encompassed in the technical scope of the present invention.

As described above, a signal circuit of the present invention includes: (i) a plurality of signal sources; (ii) a plurality of data lines to which the signal sources supply signals, respectively; and (iii) driving means for driving the data lines, the data lines being divided into a plurality of groups, each of the groups including at least one data line, adjacent groups constituting one block, the signal sources supplying the signals, at same timing, to the data lines that belong to a group selected by the driving means, respectively, wherein: the driving means selects groups which belong to a clump of blocks including a first block, and a second block adjacent to the first block so that, (i) during a first predetermined period, the driving means simultaneously selects groups that belong to the first block, and simultaneously selects groups that belong to the second block, and (ii) during a second predetermined period subsequent to the first predetermined period, the driving means selects groups one by one from groups disposed at respective ends of the clump of blocks, simultaneously selects adjacent groups that belong to different blocks, and selects remaining groups one by one.

According to the arrangement, during the first predetermined period, each terminal data line of the terminal group of each block has a change in electric potential. On the other hand, during the second predetermined period, each terminal data line of each group other than the terminal group of each block has a change in electric potential.

As such, when a combination of the first predetermined period and the second predetermined period (for example, the odd-numbered frame period and the even-numbered frame period) is regarded as one period, during such one period, the terminal data line of each group has a uniform change in electric potential.

Accordingly, for example, in cases where the data line is used as a source line for writing a signal (electric potential) in a pixel of a display apparatus, it is possible to avoid the conventional problem in which only terminal data lines of specific groups have changes in electric potential, respectively, during the first and second predetermined periods, and accordingly, display unevenness having a vertical-striped shape is enhanced for every several data lines (for every several pixels). This allows the display unevenness not to be noticeable over the entire display screen (to be difficult to visually recognize), thereby improving display quality.

It is preferable that the signal circuit is arranged so that the signal sources include (i) red, green, and blue signal lines that belong to a first signal channel and (ii) red, green, and blue signal lines that belong to a second signal channel, wherein: each of the blocks includes two groups each having three data lines, and the data lines belonging to one of the two groups correspond to the signal lines of the first signal channel, respectively, and the data lines belonging to the other of the two groups correspond to the signal lines of the second signal channel, respectively, and a data line that corresponds to a blue signal line is disposed at an end part of each group in a scanning direction.

According to the arrangement, when a group is selected, signals are simultaneously supplied to three data lines of the group thus selected, via the signal lines (red, green, blue) that correspond to the three data lines. Namely, when selecting one group, signals can be simultaneously written in one pixel. When simultaneously selecting two groups, signals can be simultaneously written in two pixels. This can dramatically reduce a frequency during a horizontal period (i.e., the time required for scanning all the data lines). Further, because the signals are simultaneously written in a plurality of data lines of each group, the driving means for selecting a group can have a simpler circuit structure (a shift register and other circuit).

Further, it is possible to have the following effect, when making the terminal data line (data line disposed at an end part of each group in the scanning direction), which has the change in electric potential, correspond to blue which has the least change in luminance when the electric potential changes. Namely, for example, in cases where the data line is used for a source line in each pixel (pixel electrode) of a display apparatus, it is possible to restrain (reduce) the display unevenness itself, which is parallel to the data lines (source lines), caused by the change in electric potential.

It is preferable that the signal circuit of the present invention is arranged so that the data lines are source lines that correspond to respective pixels of a display apparatus, and that the first predetermined period is an odd-numbered frame period, and the second predetermined period is an even-numbered frame period.

The term "frame period" means the time required for rewriting once the whole display screen of the display apparatus. That is, a first period for rewriting the display screen, a third period for rewriting the display screen, a fifth period for rewriting the display screen, . . . , correspond to an odd-numbered frame period, and a second period for rewriting the display screen, a fourth period for rewriting the display screen, a sixth period for rewriting the display screen, . . . , correspond to an even-numbered frame period.

According to the arrangement, when a combination of an odd-numbered frame and an even-numbered frame is regarded as one period (for example, the first and second period for rewriting the display screen), the terminal data lines of the respective groups have a uniform change in electric potential.

Accordingly, this can avoid the problem in which, for example, in cases where the data lines are used as the source lines provided in the respective pixels of the display apparatus, only the terminal data lines of the specific groups have the changes in electric potential respectively so that the display unevenness having the vertical-striped shape is enhanced for every several data lines (for every several pixels). Namely, this can make it difficult that the display unevenness having a vertical-striped shape is noticeable.

Further, a display apparatus of the present invention includes the aforementioned signal circuit.

To achieve the object, a method of the present invention for driving data lines, in which a plurality of signal sources supply signals to the data lines, respectively, the method including the steps of: (i) dividing a plurality of data lines into a plurality of groups, each of the groups including at least one data line, adjacent groups constituting one block; and (ii) supplying the signals, at the same timing, to the data lines that belong to a selected group, respectively, wherein: groups which belong to a clump of blocks including a first block, and a second block adjacent to the first block are selected so that: (i) during a first predetermined period, groups that belong to the first block are simultaneously selected, and then groups that belong to the second block are simultaneously selected, and (ii) during a second predetermined period subsequent to the first predetermined period, groups are selected one by one from groups disposed at respective ends of the clump of blocks, adjacent groups that belong to different blocks are simultaneously selected, and then remaining groups are selected one by one.

The following description deals with industrial applicability of the present invention. Namely, a signal circuit of the present invention, and the liquid crystal display apparatus including such a signal circuit ensure that the change in electric potential of a plurality of the source lines (data lines) are averaged and uniformized over the entire display screen during the two frame periods, the change in electric potential being caused by the parasitic capacitance occurring when signals which are supplied via the signal lines (signal sources) are written in the source lines. As such, the present invention may be applied, for example, to a display apparatus, such as a liquid crystal display apparatus, in which respective signal electric potential, supplied from a source driver, are written in a plurality of source lines that are provided to correspond to respective pixels. In especial, the effect of the present invention becomes more noticeable when the present invention is applied to a small-sized or a medium-sized high-resolution display apparatus (display panel) having restrictions on outer shape and wiring pitch.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A signal circuit, comprising:

a plurality of signal sources;

a plurality of data lines to which the signal sources supply signals, respectively; and driving means for driving the data lines, the data lines being divided into a plurality of groups, each of the groups including at least one data line, adjacent groups constituting one block, the signal sources supplying the signals, at same timing, to the data lines that belong to a group selected by the driving means, respectively, wherein:

the driving means selects groups which belong to a clump of blocks including a first block, and a second block adjacent to the first block so that, (i) during a first predetermined period, the driving means simultaneously selects groups that belong to the first block, and simultaneously selects groups that belong to the second block, and (ii) during a second predetermined period subsequent to the first predetermined period, the driving means selects groups one by one from groups disposed at respective ends of the clump of blocks, simultaneously selects adjacent groups that belong to different blocks, and selects remaining groups one by one.

2. The signal circuit as set forth in claim 1, wherein:

the signal sources include (i) red, green, and blue signal lines that belong to a first signal channel and (ii) red, green, and blue signal lines that belong to a second signal channel, each of the blocks includes two groups each having three data lines, and the data lines belonging to one of the two groups correspond to the signal lines of the first signal channel, respectively, and the data lines belonging to the other of the two groups correspond to the signal lines of the second signal channel, respectively, and a data line that corresponds to a blue signal line is disposed at an end part of each group in a scanning direction.

3. The signal circuit as set forth in claim 1, wherein:

the data lines are source lines provided so as to correspond to respective pixels of a display apparatus, and the first predetermined period is an odd-numbered frame period, and the second predetermined period is an even-numbered frame period.

4. A display apparatus, comprising a signal circuit, said signal circuit, including:

a plurality of signal sources;

a plurality of data lines to which the signal sources supply signals, respectively; and driving means for driving the data lines, the data lines being divided into a plurality of groups, each of the groups including at least one data line, adjacent groups in the groups constituting one block, the signal sources supplying the signals, at same timing, to the data lines that belong to a group selected by the driving means, respectively, wherein:

the driving means selects groups which belong to a clump of blocks including a first block, and a second block adjacent to the first block so that, (i) during a first predetermined period, the driving means simultaneously selects groups that belong to the first block, and simultaneously selects groups that belong to the second block, and (ii) during a second predetermined period subsequent to the first predetermined period, the driving means selects groups one by one from groups disposed at respective ends of the clump of blocks, simultaneously selects adjacent groups that belong to different blocks, and selects remaining groups one by one.

5. A signal circuit, comprising:

first through sixth signal sources;

a plurality of source lines which are divided into groups each including three source lines, the groups being divided into blocks each including two adjacent groups; and driving means for selecting the source lines, the groups including (i) a first group including first through third source lines, (ii) a second group including fourth through sixth source lines, (iii) a third group including seventh through ninth source lines, and (iv) a fourth group including tenth through twelfth source lines, the first and second groups constituting a first block, and the third and fourth groups constituting a second block, the first through third source lines being connected to the first through third signal sources, respectively, the fourth through sixth source lines being connected to the fourth through sixth signal sources, respectively the seventh through ninth source lines being connected to the first through third signal sources, respectively the tenth through twelfth source lines being connected to the fourth through sixth signal sources, respectively, source lines, selected by the driving means, receiving signals from the signal sources connected to the source lines thus selected, respectively, and the driving means selecting the source lines so that:

during a first predetermined period, the driving means simultaneously selects the first through sixth source lines that belong to the first block, and simultaneously selects the seventh through twelfth source lines that belong to the second block; and during a second predetermined period subsequent to the first predetermined period, the driving means simultaneously selects the first through third source lines that belong to the first group, simultaneously selects (a) the fourth to sixth source lines that belong to the second group, and (b) the seventh through ninth source lines that belong to the third group, and then simultaneously selects the tenth through twelfth source lines that belong to the fourth group.

6. The signal circuit as set forth in claim 5, wherein:

the source lines are provided so as to correspond to respective pixels in a display apparatus, each of the first and fourth signal sources is a red signal source, each of the second and fifth signal sources is a green signal source, and each of the third and sixth signal sources is a blue signal source.

7. The signal circuit as set forth in claim 5, wherein:

the source lines are provided so as to correspond to respective pixels in a display apparatus, each of the first and fourth signal sources is a green signal source, each of the second and fifth signal sources is a red signal source, and each of the third and sixth signal sources is a blue signal source.

8. The signal circuit as set forth in claim 5, wherein:

the source lines are provided so as to correspond to respective pixels in a display apparatus, the first predetermined period is an odd-numbered frame period, and the second predetermined period is an even-numbered frame period.

9. A display apparatus, comprising a signal circuit, said signal circuit, including:

first through sixth signal sources;

a plurality of source lines which are divided into groups each including three source lines, the groups being divided into blocks each including two adjacent groups; and driving means for selecting the source lines, the groups including (i) a first group including first through third source lines, (ii) a second group including fourth through sixth source lines, (iii) a third group including seventh through ninth source lines, and (iv) a fourth group including tenth through twelfth source lines, the first and second groups constituting a first block, and the third and fourth groups constituting a second block, the first through third source lines being connected to the first through third signal sources, respectively, the fourth through sixth source lines being connected to the fourth through sixth signal sources, respectively the seventh through ninth source lines being connected to the first through third signal sources, respectively the tenth through twelfth source lines being connected to the fourth through sixth signal sources, respectively, source lines, selected by the driving means, receiving signals from the signal sources connected to the source lines thus selected, respectively, and the driving means selecting the source lines so that:

during a first predetermined period, the driving means simultaneously selects the first through sixth source lines that belong to the first block, and simultaneously selects the seventh through twelfth source lines that belong to the second block; and during a second predetermined period subsequent to the first predetermined period, the driving means simultaneously selects the first through third source lines that belong to the first group, simultaneously selects (a) the fourth to sixth source lines that belong to the second group, and (b) the seventh through ninth source lines that belong to the third group, and then simultaneously selects the tenth through twelfth source lines that belong to the fourth group.

10. A method for driving data lines, in which a plurality of signal sources supply signals to the data lines, respectively, said method, comprising the steps of: dividing a plurality of data lines into a plurality of groups, each of the groups including at least one data line, adjacent groups constituting one block; and supplying the signals, at the same timing, to the data lines that belong to a selected group, respectively, wherein:

groups which belong to a clump of blocks including a first block, and a second block adjacent to the first block are selected so that:

(i) during a first predetermined period, groups that belong to the first block are simultaneously selected, and then groups that belong to the second block are simultaneously selected, and (ii) during a second predetermined period subsequent to the first predetermined period, groups are selected one by one from groups disposed at respective ends of the clump of blocks, adjacent groups that belong to different blocks are simultaneously selected, and then remaining groups are selected one by one.

11. A method for driving data lines, in which signals are respectively supplied to a plurality of data lines which are divided into groups each including three data lines, the groups being divided into blocks each including two adjacent groups, said method, comprising the steps of:

causing first and second groups to constitute a first block, and causing third and fourth groups to constitute a second block, the first group including first through third data lines, the second group including fourth through sixth data lines, the third group including seventh through ninth data lines, and the fourth group including tenth through twelfth data lines, and selecting the data lines so that:

during a first predetermined period, the first through sixth data lines that belong to the first block are simultaneously selected, and the seventh through twelfth data lines that belong to the second block are simultaneously selected; and during a second predetermined period subsequent to the first predetermined period, the first through third data lines that belong to the first group are simultaneously selected, (a) the fourth to sixth data lines that belong to the second group, and (b) the seventh through ninth data lines that belong to the third group are simultaneously selected, and then the tenth through twelfth data lines that belong to the fourth group are simultaneously selected.

* * * * *